(12) United States Patent
Gu et al.

(10) Patent No.: US 11,719,584 B2
(45) Date of Patent: Aug. 8, 2023

(54) COMPLEMENTARY RING OSCILLATORS TO MONITOR IN-SITU STRESS WITHIN INTEGRATED CIRCUITS

(71) Applicant: Huawei Technologies Co., Ltd., Shenzhen (CN)

(72) Inventors: Shiqun Gu, San Diego, CA (US); Hong Liu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 104 days.

(21) Appl. No.: 17/351,675

(22) Filed: Jun. 18, 2021

(65) Prior Publication Data

US 2021/0310880 A1 Oct. 7, 2021

Related U.S. Application Data

(63) Continuation of application No. PCT/CN2019/124422, filed on Dec. 11, 2019.

(Continued)

(51) Int. Cl.
*G01R 31/28* (2006.01)
*G01K 7/42* (2006.01)
(Continued)

(52) U.S. Cl.
CPC ......... *G01K 7/425* (2013.01); *G01R 31/2628* (2013.01); *G01R 31/2856* (2013.01); *H01L 23/34* (2013.01)

(58) Field of Classification Search
CPC ............ G01R 31/2856; G01R 31/2642; G01R 31/275; G01R 31/2884; G01R 31/2874;
G01R 31/3004; G01R 31/3016; G01R 31/2621; G01R 31/2882; G01R 31/3008; G01R 31/2817; G01R 31/2855; G01R 31/2628; G01R 31/31709; G01R 23/02; G01R 31/31937; G01R 31/2853; G01R 31/2872; G01R 31/31707; G01R 19/175; G01R 31/2607; G01R 31/282; G01R 31/2831; G01R 31/2832; G01R 31/31727;
(Continued)

(56) References Cited

U.S. PATENT DOCUMENTS 6,476,632 B1 * 11/2002 La Rosa ............ G01R 31/2824
324/762.05
7,205,854 B2 * 4/2007 Liu .................. G01R 31/31727
324/762.02

(Continued)

FOREIGN PATENT DOCUMENTS

CN 102495352 A 6/2012

*Primary Examiner* — Vinh P Nguyen
(74) *Attorney, Agent, or Firm* — Slater Matsil, LLP

(57) ABSTRACT

The disclosure relates to technology for determining stress on integrated circuits. These include using ring oscillators formed on the integrated circuit, where one ring oscillator has its frequency dependent on the current flowing through its stages being limited by its NMOS devices and another ring oscillator has its frequency dependent on the current flowing through its stages being limited by its PMOS devices. This allows the stress on the integrated circuit to be determined in different directions along the integrated circuit. A temperature sensor can be used to compensate for temperature dependence on the frequencies of the ring oscillators.

38 Claims, 7 Drawing Sheets

Related U.S. Application Data

(60) Provisional application No. 62/783,474, filed on Dec. 21, 2018.

(51) Int. Cl.
*G01R 31/26* (2020.01)
*H01L 23/34* (2006.01)

(58) Field of Classification Search
CPC ............ G01R 31/2601; G01R 31/2619; G01R 31/2644; G01R 31/2818; G01R 31/2824; G01R 27/28; G01R 31/2639; G01R 31/2623; G01R 31/2851; G01R 31/31703; G01R 31/2837; G01R 31/396; G01R 31/00; G01R 31/14; G01R 31/26; G01R 31/2881; G01R 31/2891; H03K 3/0315; H03K 3/011; H03K 17/102; H03K 19/003; H03K 17/145; H03K 5/26; H03K 19/00384; H03K 3/35613; H03K 19/00323; H01L 22/34; H01L 2924/14; G06F 11/008; G01D 3/036; G01N 27/00; G01N 27/228; G01K 7/01; G01K 7/32; G01K 15/005; G01K 17/00; G01K 7/00; G01K 7/346; G01K 7/015; G01K 7/425

See application file for complete search history.

(56) References Cited

U.S. PATENT DOCUMENTS

| | | | |
|---|---|---|---|
| 9,035,706 B2 * | 5/2015 | Chen | H03K 3/0315 331/55 |
| 9,429,618 B2 * | 8/2016 | Hwang | G01R 31/2644 |
| 9,970,830 B2 * | 5/2018 | Kothandaraman | G01R 31/2856 |
| 10,036,773 B1 * | 7/2018 | Ghosh | G01R 23/02 |
| 11,349,458 B1 * | 5/2022 | Ghosh | H03K 3/354 |
| 2005/0212543 A1 | 9/2005 | Suzuki | |
| 2006/0238267 A1 | 10/2006 | Bienek et al. | |
| 2011/0090015 A1 | 4/2011 | Sumita et al. | |
| 2017/0350938 A1 | 12/2017 | Kang et al. | |

* cited by examiner

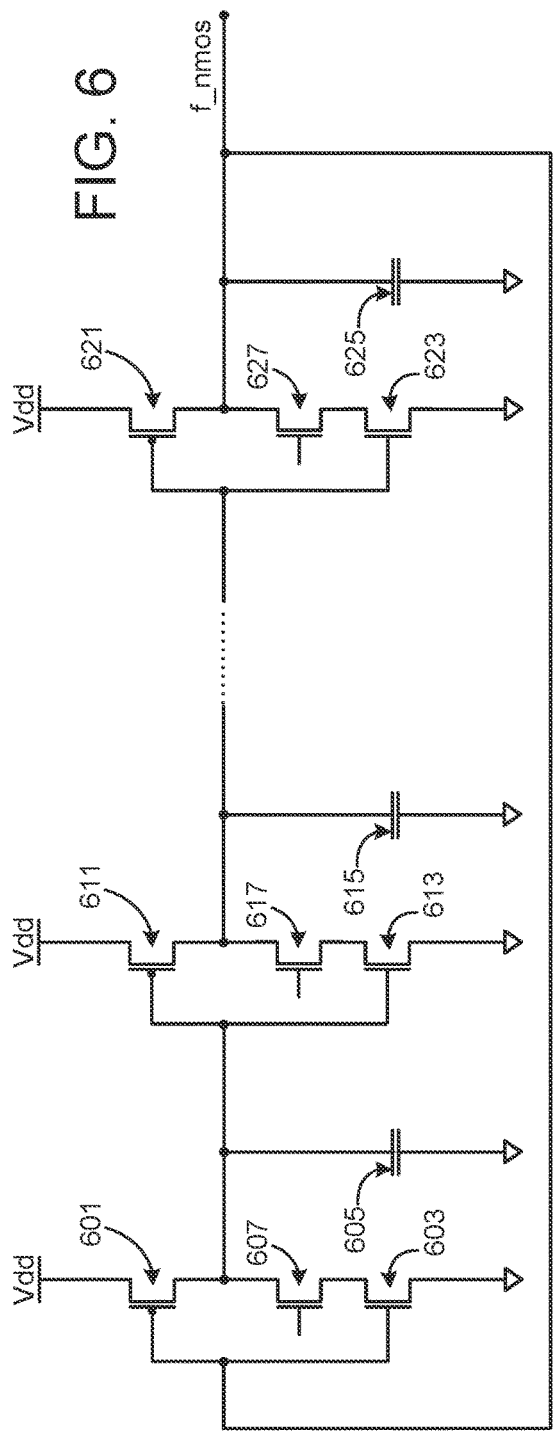
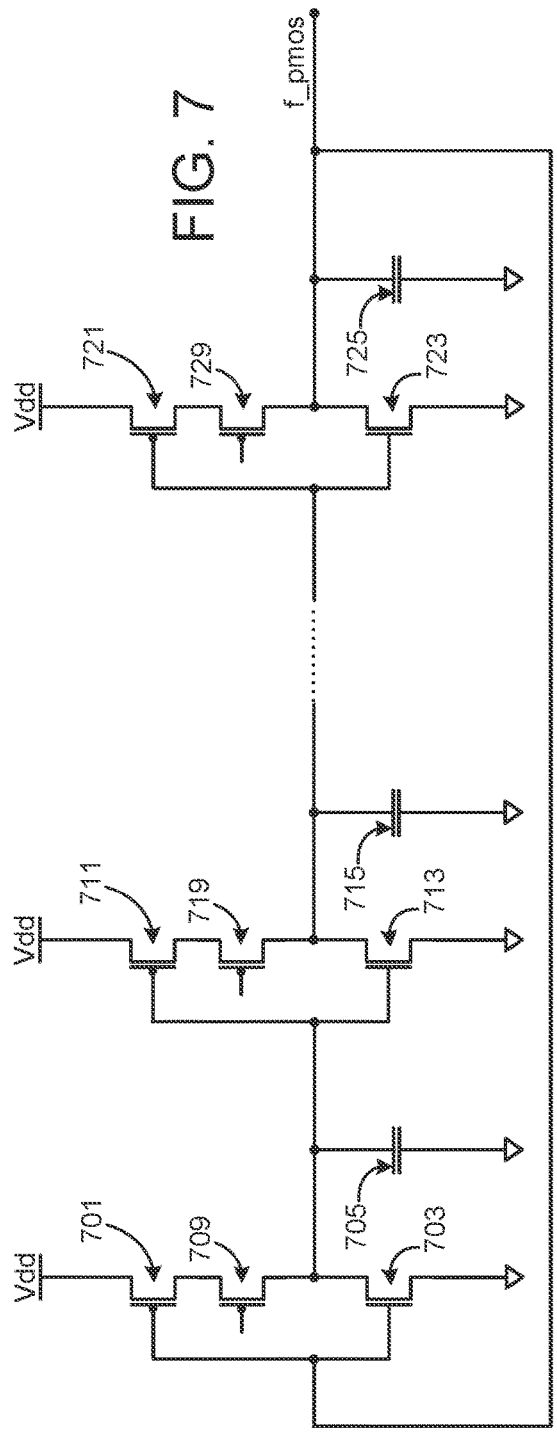

COMPLEMENTARY RING OSCILLATORS TO MONITOR IN-SITU STRESS WITHIN INTEGRATED CIRCUITS

CROSS-REFERENCE TO RELATED APPLICATIONS

This application is a continuation of International Application No. PCT/CN2019/124422, filed on Dec. 11, 2019 which claims benefit to U.S. provisional patent application Ser. No. 62/783,474, filed on Dec. 21, 2018 and entitled "Complementary Ring Oscillators To Monitor In-Situ Stress Within Integrated Circuits", which is incorporated herein by reference as if reproduced in its entirety.

TECHNICAL FIELD

The disclosure generally relates to circuits for determining stress levels on integrated circuits.

BACKGROUND

To increase the chipset performance, the die size of integrated circuits keep increasing, as does the package size. However, there are property mismatches between the different materials (silicon, underfill/mold, laminate substrate and printed circuit board) of a package of integrated circuits that can produce high mechanical stresses on the integrated circuit die in such packages. In addition, to reduce the thermal resistance, the package lid may be removed on the backside of the integrated circuit so that a heat spreader is directly attached to the integrated circuit. With the aging of materials and temperature variation, these stresses can vary during operation and may reach critical values, impacting a chip set's reliability. Therefore, it can be useful to monitor the stress of the integrated circuits in-situ, on the die itself, and to prevent catastrophic system failure.

SUMMARY

According to a first aspect of the present disclosure, a stress sensor comprises a first ring oscillator circuit formed on an integrated circuit, a second ring oscillator circuit formed on the integrated circuit in proximity to the first ring oscillator circuit, and a stress determination circuit. The first ring oscillator circuit comprises one or more inverter stages each having first P-channel metal-oxide-semiconductor field-effect transistor (PROS) device and a first N-channel metal-oxide-semiconductor field-effect transistor (NMOS) device connected in series between a high voltage supply level and a low voltage supply level such that the first NMOS device limits current flowing through the inverter stage relative to the first PMOS device. The second ring oscillator circuit formed comprises one or more inverter stages each having a second PMOS device and a second NMOS device connected in series between the high voltage supply level and the low voltage supply level such that the second PMOS device limits current flowing through the inverter stage relative to the second NMOS device. The stress determination circuit is configured to receive a first frequency signal generated by the first ring oscillator circuit and a second frequency signal generated by the second ring oscillator circuit and to determine from the first frequency signal and the second frequency signal a first stress value for a stress level along a first direction of the integrated circuit and a second stress value for a stress level along a second direction of the integrated circuit, the second direction being non-parallel to the first direction.

Optionally, in a second aspect and in furtherance of the preceding aspect, for each of the one or more inverter stages of the first ring oscillator circuit, the first NMOS device has a narrower width than the first PMOS device, and for each of the one or more inverter stages of the second ring oscillator circuit, the second PMOS device has a narrower width than the second NMOS device.

Optionally, in a third aspect and in furtherance of any of the preceding aspects, each of the one or more inverter stages of the first ring oscillator circuit further comprise a third NMOS device connected in series with the first PMOS device and the first NMOS device between the high voltage supply level and the low voltage supply level, an input of each of the inverter stages connected to a control gate of the first PMOS device and a control gate of the third NMOS device and an output of each of the inverter stages is connected to a node through which the first PMOS device is connected to the third NMOS device.

Optionally, in a fourth aspect and in furtherance of any of the third aspect, for each of the one or more inverter stages, the first NMOS device is connected between the node and the third NMOS device.

Optionally, in a fifth aspect and in furtherance of any of the third and fourth aspects, for each of the one or more inverter stages, the control gate of the first NMOS device is biased at a fixed level.

Optionally, in a sixth aspect and in furtherance of any of the preceding aspects, each of the one or more inverter stages of the second ring oscillator circuit further comprises a third PMOS device connected in series with the second PMOS device and the second NMOS device between the high voltage supply level and the low voltage supply level, an input of each of the inverter stages connected to a control gate of the third PMOS device and a control gate of the second NMOS device and an output of each of the inverter stages is connected to a node through which the third PMOS device is connected to the second NMOS device.

Optionally, in a seventh aspect and in furtherance of the sixth aspect, for each of the one or more inverter stages, the second PMOS device is connected between the node and the third PMOS device.

Optionally, in an eighth aspect and in furtherance of any of the sixth and seventh aspects, for each of the one or more inverter stages, the control gate of the second PMOS device is biased at a fixed level.

Optionally, in a ninth aspect and in furtherance of any of the preceding aspects, the first PMOS device and the first NMOS device of each of the inverter stages of the first ring oscillator circuit and the second PMOS device and the second NMOS device of each of the inverter stages of the second ring oscillator circuit are oriented in a same direction on the integrated circuit.

Optionally, in a tenth aspect and in furtherance of any of the preceding aspects, the first PMOS device and the first NMOS device of each of the inverter stages of the first ring oscillator circuit and the second PMOS device and the second NMOS device of each of the inverter stages of the second ring oscillator circuit are fin field-effect transistors (FinFETs).

Optionally, in an eleventh aspect and in furtherance of any of the preceding aspects, the stress determination circuit is further configured to receive a temperature value and to compensate the first stress value and the second stress value based on the temperature value.

Optionally, in a twelfth aspect and in furtherance of any of the preceding aspects, the stress sensor further comprises a time slot generator configured to provide a common enable signal to the first ring oscillator circuit and the second ring oscillator circuit.

Optionally, in a thirteenth aspect and in furtherance of any of the preceding aspects, the stress sensor further comprises: a first counter configured to receive the first frequency signal from the first ring oscillator circuit and provide the first frequency signal to the stress determination circuit in as a digital value; and a second counter configured to receive the second frequency signal from the second ring oscillator circuit and provide the second frequency signal to the stress determination circuit in as a digital value.

Optionally, in a fourteenth aspect and in furtherance of any of the preceding aspects, the second ring oscillator circuit is formed on the integrated circuit within a millimeter of the first ring oscillator circuit.

Optionally, in a fifteenth aspect and in furtherance of any of the preceding aspects, the stress determination circuit is further configured to issue a system alarm in response to the first stress value exceeding a first critical value and in response to the second stress value exceeding a second critical value.

According to one other aspect of the present disclosure, an integrated circuit comprises one or more logic circuits, a temperature sensor configured to determine a temperature value for the integrated circuit, and a stress sensing circuit in proximity to the temperature sensor. The stress sensing circuit includes one or more ring oscillator circuits and a stress determination circuit. The one or more ring oscillator circuits comprise one or more inverter stages each having a P-channel metal-oxide-semiconductor field-effect transistor (PMOS) device and a N-channel metal-oxide-semiconductor field-effect transistor (NMOS) device connected in series between a high voltage supply level and a low voltage supply level. The stress determination circuit is configured to receive one or more frequency signals generated by a corresponding one of the ring oscillator circuits and to receive the temperature value, and further configured to determine from the one or more frequency signals a stress value for a stress level of the integrated circuit and compensate the stress value based on the temperature value.

According to one other aspect of the present disclosure, a method of monitoring stress on an integrated circuit is presented. A first ring oscillator on the integrated circuit and a second ring oscillator adjacent to the first ring oscillator on the integrated circuit are enabled. The first ring oscillator and the second ring oscillator are subsequently disabled after a time interval. A first count, corresponding to a number of cycles executed by the first ring oscillator during the time interval, is determined. A second count, corresponding to a number of cycles executed by the second ring oscillator, is determined. From the first count a first stress value for a stress level of the integrated circuit along a first direction is determined. From the second count a second stress value for a stress level of the integrated circuit along a second direction is determined, the second direction being non-parallel to the first direction.

Embodiments of the present technology described herein provide improvements to techniques for determining stress on integrated circuits. These include using ring oscillators formed on the integrated circuit, where one ring oscillator has its frequency dependent on the current flowing through its stages being limited by its NMOS devices and another ring oscillator has its frequency dependent on the current flowing through its stages being limited by its PMOS devices. This allows the stress on the integrated circuit to be determined in different directions along the integrated circuit. A temperature sensor can be used to compensate for temperature dependence of the frequencies of the ring oscillators.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

FIGS. 6 and 7 respectively illustrate an NMOS dominated ring oscillator and a PMOS dominated ring oscillator.

DETAILED DESCRIPTION OF ILLUSTRATIVE EMBODIMENTS

The present disclosure will now be described with reference to the figures, which in general relate to circuits and techniques for determining stress level on integrated circuits. Packages and circuit boards for integrated circuits produce mechanical stress on the integrated circuit dies, which may degrade the circuits' function and impact circuit reliability. A ring oscillator (RO) frequency changes with stress. The following describes the use of ring oscillators to determine stress levels for integrated circuits through use of an in-situ stress sensor, formed on the integrated circuit itself. As ring oscillators are also sensitive to temperature, a ring oscillator can be combined with a temperature sensor to decouple the temperature effect. As N-channel metal-oxide-semiconductor (NMOS) field-effect transistors and P-channel metal-oxide-semiconductor (PMOS) field-effect transistors behave differently to stress direction, by using NMOS transistors to limit the current though the inverter stages of one ring oscillator and using PMOS transistors to limit the current through the inverter stages of another ring oscillator, the ring oscillators can decouple stress parallel to the channel of the transistors from stress perpendicular to the channel.

It is understood that the present embodiments of the disclosure may be implemented in many different forms and that scope of the claims should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
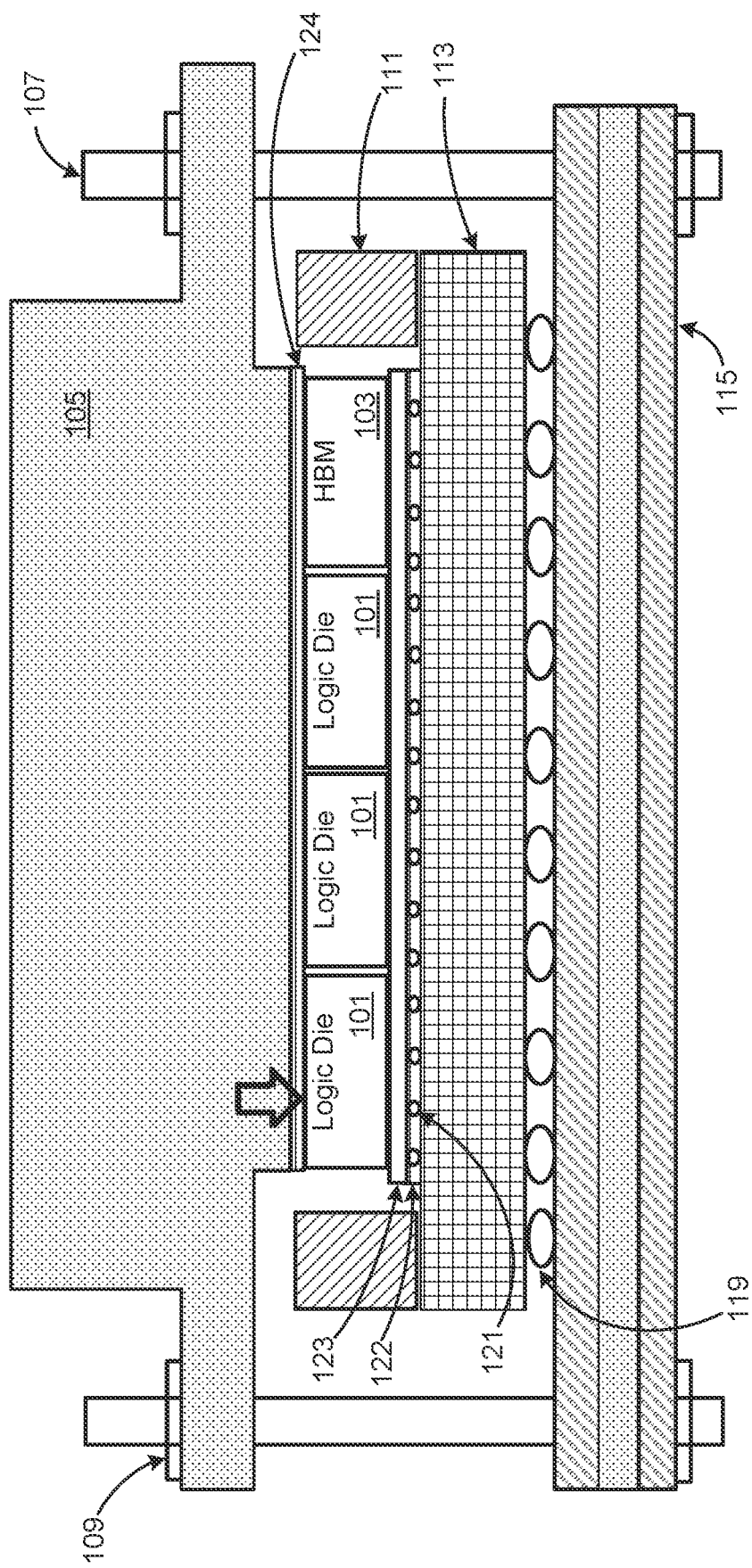
FIG. 1 illustrates an example of a package of several integrated circuits and stresses that can arise for such integrated circuits.

Before providing additional details for ring oscillator circuits to determine stress level on integrated circuits, FIG. 1 is used to describe an example of a package of several integrated circuits and how stresses can arise for such circuits. In the example of FIG. 1, the package of includes a chip set of three processor or logic die 101 and a High Bandwidth Memory (HBM) cube 103, which are mounted on a silicon (Si) interposer or FANOUT layers 123. The logic die 101 and HBM cube 103 on the Si interposer or FANOUT layers 123 can be incorporated into a package that also includes other Si interposers and chips, where the Interposer is mounted to the package on a series of solder bumping balls 121. The package includes underfill/mold materials 122 below or above laminate substrate (113) and to the side stiffener (iii) to enclose the package, where the top of the package has been removed. One or more such packages can be mounted on a series of solder balls (119) onto a printed circuit board (PCB) 115. On top of the package holding logic die 101 and HBM cube 103 is a heat dispenser or spreader 105. A set of posts 107 connect the heat dispenser or spreader 105 to the laminate substrate 115, where a set of screws or nuts 109 tighten the structure together.

To increase the chipset performance, the die size of the logic die 101 and HBM cube 103 continue to increase, such as having a size of about 8 cm2, and the package size is also increasing. However, there are property mismatches between the different materials (the silicon of logic die 101 and HBM cube 103, the underfill/mold material 122, Si interposer 123 laminate substrate 113 and PCB 115), which produce mechanical high mechanical stress to the logic die 101 and HBM cube 103 die.

In addition, to reduce the thermal resistance, as shown in FIG. 1 the package lid can be removed on the backside of logic die 101 and HBM cube 103 and heat spreader is directly attached to the high power integrated circuits so heat dispenser or spreader 105 is directly on the chips to be more efficient. Between the heat dispenser or spreader 105r and chip 101 or 103, there will be thermal intermetallic material (TIM) or compound 124, which can be a composite of organic and inorganic. With the aging of materials and temperature variation, these stresses could vary during operation which may reach critical values, and impact chip set reliability. For example, the tension of the screw 109 may loosen or the underfill material 122 below the left-most logic die 101, resulting in an increased stress as represented by the arrow. Therefore, it is desired to monitor the stress in-situ, and prevent catastrophic system failure.

Figure 2:
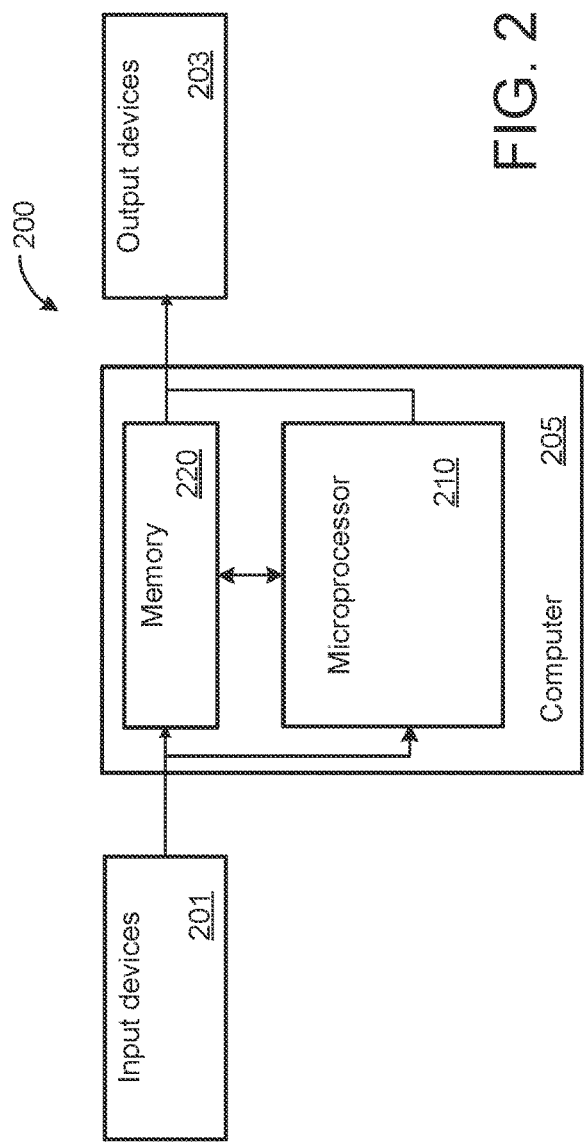
FIGS. 2 and 3 are respectively block diagrams of a computer system and a microprocessor that can be incorporated into such a computer system.
Figure 3:
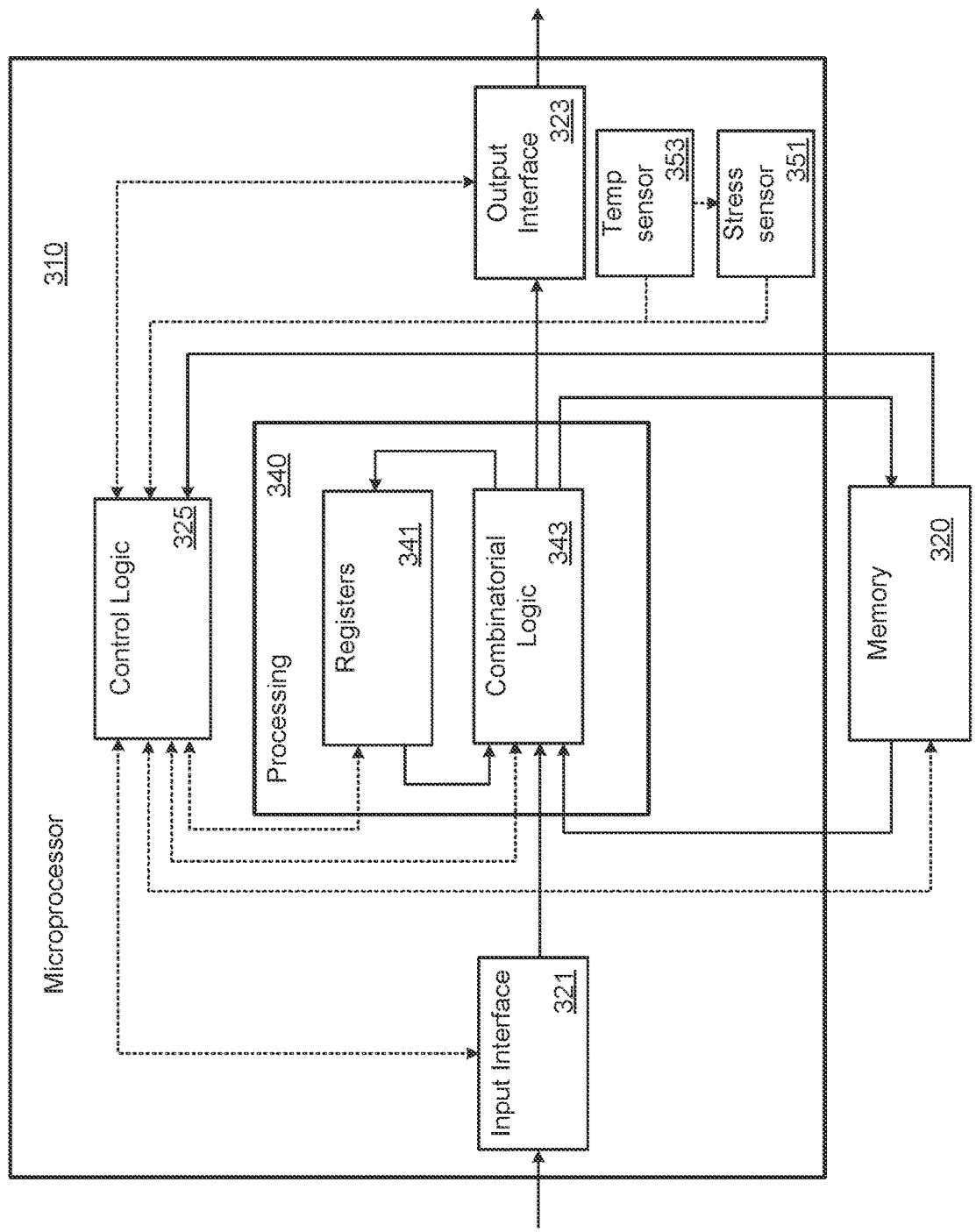

The package of FIG. 1 can form or be part of a microprocessor or computer system, such as illustrated with respect to FIGS. 2 and 3. FIGS. 2 and 3 are respectively block diagrams of a computer system and a microprocessor such as can be incorporated into such a computer system. In the simplified representation of FIG. 2, the computer system 200 includes a computer 205, one or more input devices 201 and one or more output devices 203. Common examples of input devices 201 include a keyboard or mouse. Common examples of output devices 203 include monitors or printers. The computer 205 includes memory 220 and microprocessor 210, where in this simplified representation the memory 220 is represented as a single block. The memory 220 can include ROM memory, RAM memory and non-volatile memory and, depending on the embodiment, include separate memory for data and instructions.

FIG. 3 illustrates one embodiment for the microprocessor 310 of FIG. 1 and also includes the memory 320. In the representation of FIG. 2, the microprocessor 310 includes control logic 325, a processing section 340 of one or more logic circuits, an input interface 321, and an output interface 323. The dashed lines represent control signals exchanged between the control logic 325 and the other elements of the microprocessor 310 and the memory 320. The solid lines represent the flow of data and instructions within the microprocessor 310 and between the microprocessor 310 and memory 320.

The processing block 340 includes combinatorial logic 343 that is configured to execute instructions and registers 341 in which the combinatorial logic stores instructions and data while executing these instructions. In the simplified representation of FIG. 2, specific elements or units, such as an arithmetic and logic unit (ALU), floating point unit, and other specific elements commonly used in executing instructions are not explicitly shown in the combinatorial logic 343 block. The combinatorial logic 343 is connected to the memory 320 to receive and execute instruction and supply back the results. The combinatorial logic 343 is also connected to the input interface 321 to receive input from input devices 201 or other sources and to the output interface 323 to provide output to output devices 203 or other destinations.

In some embodiments, the microprocessor 310 of FIG. 3 corresponds to an integrated circuit. Also formed on the integrated circuit is a stress sensor 351 to detect stress levels on the integrated circuit. As described in the following, the stress sensor 351 can be based on one or more ring oscillators whose frequency will vary in response to stress levels experienced by the integrated circuit based on the properties of NMOS and PMOS devices. As the frequency of a ring oscillator can also vary based on temperature, a temperature sensor 353, such as based on the band gap properties of a diode can also be included. The stress sensor 351 can receive a temperature value from the temperature sensor 353, which can be used to factor out the temperature effects and isolate the stress. So that the temperature value from the temperature sensor 353 reflects the temperature experienced by the ring oscillators of stress sensor 351, they should be near each other on the integrated circuit, such as having a separation of within a millimeter or one half of a millimeter. The stress sensor 351 and, for embodiments also including it, the temperature sensor 353 can be located at sensitive locations of an integrated circuit chip, such as a chip corner or edge, for example. Although the following discussion is presented primarily in the context of a microprocessor as the integrated circuit, since these tend to be larger IC die which are more susceptible to stress, it will be understood that the described techniques readily apply to other embodiments.

Figure 4:
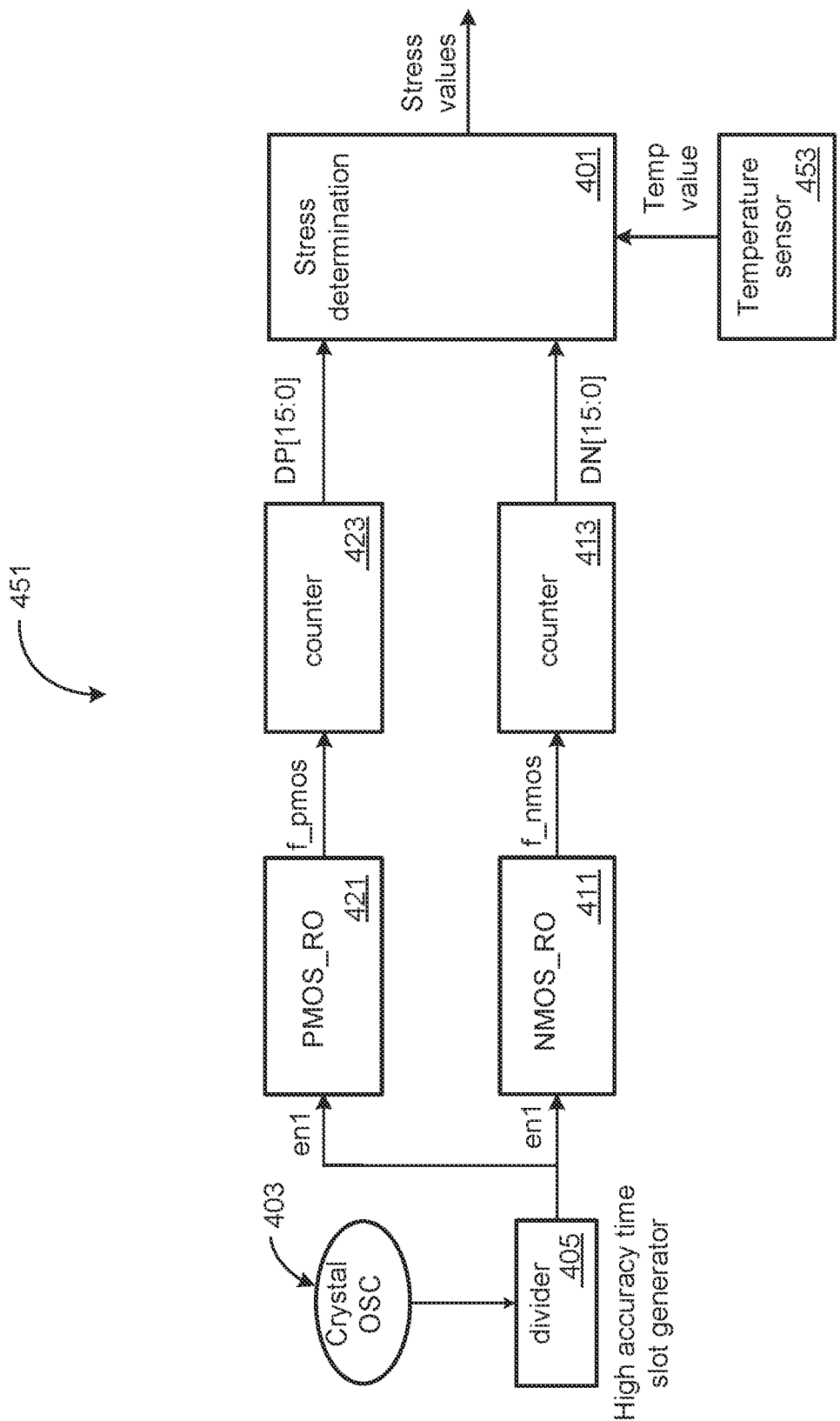
FIG. 4 illustrates an embodiment for a stress sensor including a frequency to digital converter.

FIG. 4 illustrates an embodiment for a stress sensor 451 including a frequency to digital converter. The embodiment of FIG. 4 includes a first ring oscillator NMOS_RO 411 and a second ring oscillator PMOS_RO 421. As discussed further with respect to FIGS. 5-7, a PMOS device and an NMOS device typically have different responses to stress. More specifically, a PMOS will tend to have an increasing drain current with compressive stress along its channel, but having less sensitivity to stress perpendicular to its channel. In contrast, an NMOS with tend to have a decreasing drain current with compressive stress both along and perpendicular to its channel. By making the frequency of ring oscillator PMOS_RO 421 more dependent on PMOS devices and the frequency of ring oscillator NMOS_RO 411 more dependent on NMOS devices, this differential behavior to stress can be exploited to determine in plane and out of plane stress levels on the IC chip.

Based upon an enable signal en1, NMOS_RO 411 and PMOS_RO 421 are enabled for a time interval and then disabled. Over this time period, NMOS_RO 411 will be operating with a frequency f_nmos and PMOS_RO 421 will be operating with a frequency f_pmos, where the stress on the IC chip will be reflected in f_nmos and f_pmos. Counters 413 and 423 will respectively count the number of cycles of NMOS_RO 411 and PMOS_RO 421 over the interval while the ring oscillators are enabled by the en1 signal.

The enable signal en1 can be generated by a high accuracy time slot generator. In the embodiment of FIG. 4, this includes an oscillator, here a crystal oscillator OSC 403. The oscillator's signal is provided to a divider 405, which can then reduce the frequency of the signal from the oscillator. The enable signal ern can then correspond to a set number of cycles form the divider.

From the frequencies f_nmos and f_pmos, counters 413 and 423 respectively generate the (16-bit in this example) digital count values DN[15:0] and DP[15:0]. A stress determination circuit 401 receives the counts and translates these into stress values, as described further with respect to FIGS. 8-10. FIG. 4 also includes a temperature sensor 453, such as a band gap device, that determines a temperature value and provide this to the stress determination circuit 401. The stress determination circuit 401 can use the temperature value to factor the temperature influence from the counts DN[15:0] and DP[15:0] and, in turn, from the stress values.

Figure 5:
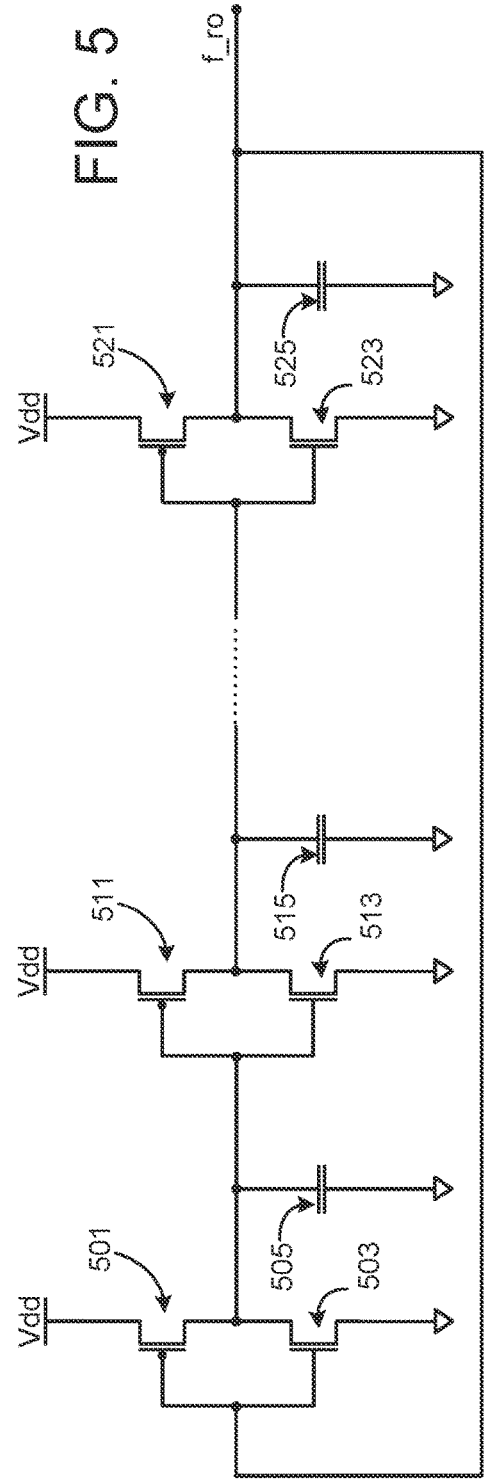
FIG. 5 illustrates an example of a ring oscillator circuit.

FIG. 5 illustrates an example of a ring oscillator circuit. A ring oscillator is a device composed of an odd number of inverters, or NOT gates, connected in a ring, having the output of each inverter connected to the input next inverter in the chain, with the output of the last inverter is fed back into the first. The output of each inverter oscillates between high and low, driving the next stage, so that the ring oscillator's frequency will depend upon the number of stages and the rate at which the capacitors 505, 515, 525 charge and discharge.

In FIG. 5, each inverter is formed of a PMOS, NMOS pair connected in series between a high supply level Vdd on the integrated circuit and a low supply level, here represented as ground. FIG. 5 shows a first inverter of PMOS 501 and NMOS 503, a second inverter of PMOS 511 and NMOS 513, and, after a number of intervening stages represented by the ellipsis, an n-th inverter of PMOS 521 and NMOS 523. Each inverter drives a corresponding fixed load of capacitor similar to capacitors 505, 515, or 525. In one set of embodiments, the PMOS and NMOS transistors can be formed from fin field-effect transistors, or finFETs, which are MOSFETs built on a substrate where the gate is placed on two, three, or four sides of the channel or wrapped around the channel, forming a double gate structure. These devices have been given the generic name "finFETs" because the source/drain region forms fins on the silicon surface.

The frequency of the ring oscillator of FIG. 5 is a strong function of the drive strength of the transistors in the inverter stages, as this will determine the rate at which the capacitors 505, 515, and 525 charge and discharge. Stress will impact the channel mobility and the transistors' drain-source current Idsat. Typically, a PMOS's Idsat increases with compressive stress along the channel, but is less sensitive to the stress perpendicular to the channel. For an NMOS, Idsat decreases with compressive stress both along and perpendicular to the channel. For advanced node devices, has a scale of <32 nm, such as 16 nm, the transistor channel direction of all of the devices is typically fixed, so that no 90 degree channel is allowed.

To delineate the difference in PMOS and NMOS response to stress, a pair of ring oscillators, as with PMOS_RO 421 and NMOS_RO 411 of FIG. 4 can be used. For NMOS_RO 411, the inverters can use a relatively wider PMOS width (such as by having more fins in a finFET embodiment), so that the NMOS_RO 411 frequency f_nmos will be limited by the NMOS devices 503, 513, 523. For PMOS_RO 421, the inverter stages can use a relatively wider NMOS width (such as by having more fins in a finFET embodiment), so that the PMOS_RO frequency f_pmos will be limited by the PMOS devices 501, 511, 521. By comparing the response of the two ring oscillators, the stress determination circuit 4oi can extract the stress along the channel axis and perpendicular to the channel axis.

In another set of embodiments, rather than use different relative widths between the NMOS and PMOS devices of one or more of the inverter stages in the ring oscillator of FIG. 5 (i.e., sizing PMOS 501 larger than NMOS 503 in NMOS_RO 411, and sizing NMOS 503 larger than PMOS 501 in PMOS_RO 521), an additional NMOS or PMOS can be added in to the inverters to restrict the current. FIGS. 6 and 7 respectively illustrate an NMOS dominated ring oscillator and a PMOS dominated ring oscillator.

FIG. 6 repeats the elements of FIG. 5, with a first stage of inverter of PMOS 601 and NMOS 603 driving capacitor 605 and connected to the input of following stage of PMOS 611 and NMOS 613 driving capacitor 615, so on with the n-th inverter of PMOS 621 and NMOS 623 driving capacitor 625 for the output. Each of the PMOS, NMOS pairs of each inverter stage can be matched, being similarly sized as in a typical digital switch, but where an additional NMOS is added to restrict the current in each inverter stage. More specifically, in the first stage an additional NMOS 607 is added in the discharge path for the capacitor 605, between the stage's output and NMOS 603. The NMOS 607 is sized smaller that NMOS 603 and PMOS 601 and biased at a fixed voltage level. Use of a low bias can help reduce drift such as bias temperature instability (BTI), hot carrier injection (HCI), and other effects. This results in NMOS 607 having a relatively large channel resistance, so that it will dominate the frequency response. Similarly, NMOS 617 can added to the second inverter stage and NMOS 627 can be added to the n-th stage, with similar additions to the intervening inverter stages.

FIG. 7 presents an PMOS dominated ring oscillator. FIG. 7 again repeats the elements of FIG. 5, with a first stage of inverter of PMOS 701 and NMOS 703 driving capacitor 705 and connected to the input of following stage of PMOS 711 and NMOS 713 driving capacitor 715, so on with n-th inverter of PMOS 721 and NMOS 723 driving capacitor 725 for the output. Each of the PMOS, NMOS pairs of each inverter stage can be matched, being similarly sized as in a typical digital switch, but where an additional PMOS is added to restrict the current in each inverter stage. More specifically, in the first stage an additional PMOS 709 is added in the charge path for the capacitor 705, between PMOS 701 and the stage's output. The PMOS 709 is sized smaller that NMOS 603 and PMOS 601 and biased at a fixed voltage level. As with NMOS dominated ring oscillator, use of a low bias can help reduce drift such as bias temperature instability (BTI), hot carrier injection (HCI), and other effects. This results in PMOS 709 having a relatively large channel resistance, so that it will dominate the frequency response. Similarly, PMOS 719 can added to the second inverter stage and PMOS 729 can be added to the n-th stage, with similar additions to the intervening inverter stages.

Figure 9:
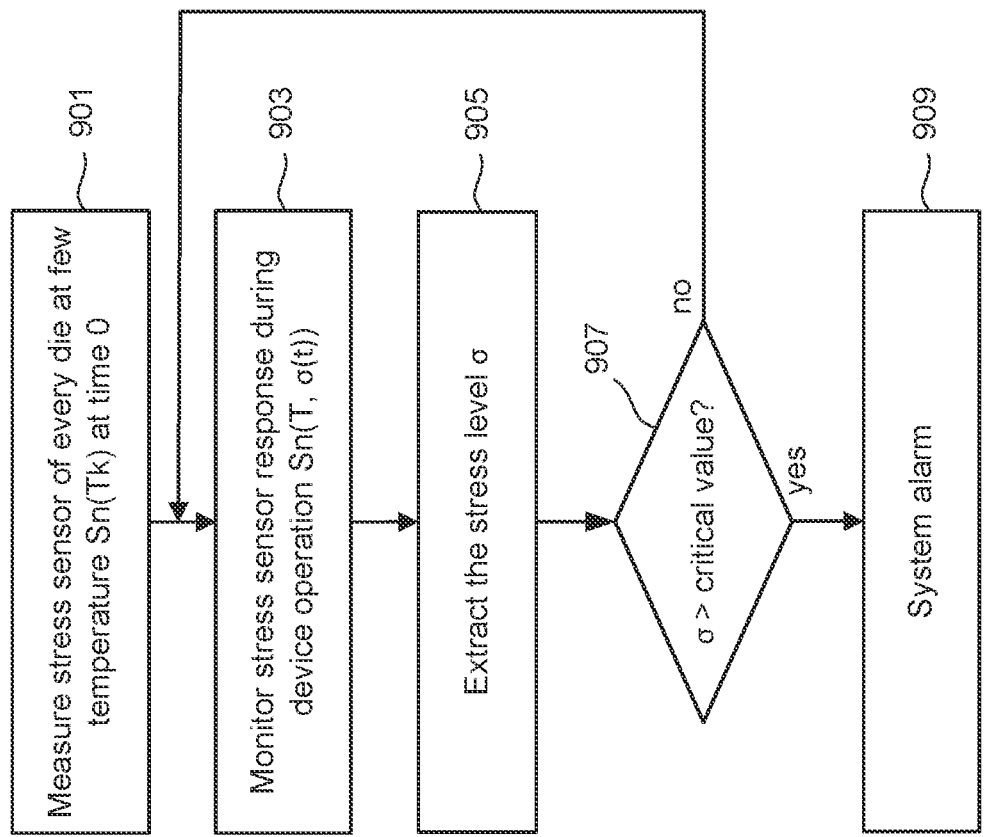
FIGS. 8 and 9 are respectively flowcharts for embodiments of a process calibrating the response of stress detection circuits and a process operating such a device on an integrated circuit.
Figure 8:
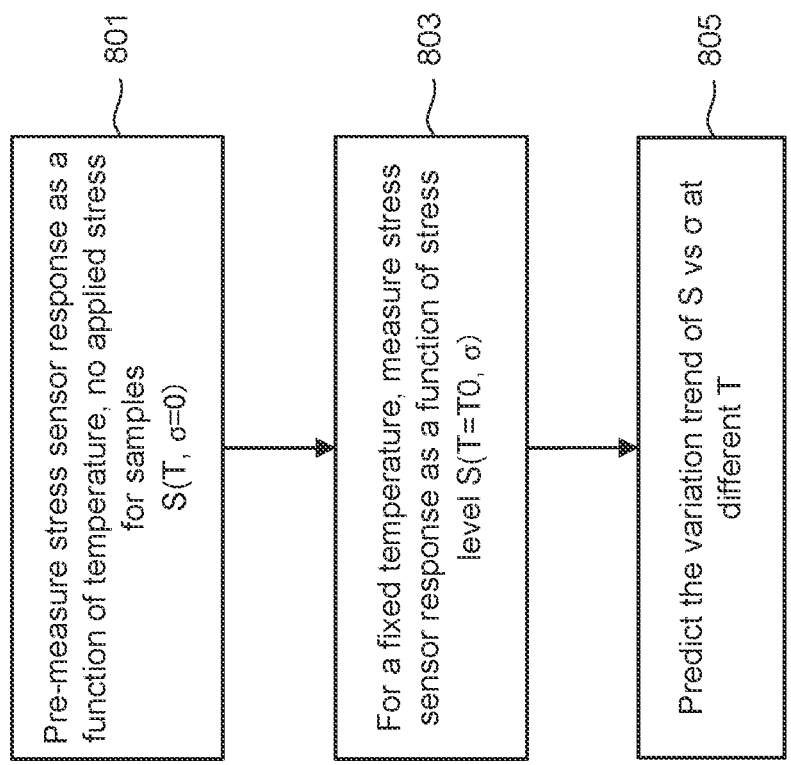

FIGS. 8 and 9 are respectively flowcharts for embodiments of a process calibrating the response of stress detection circuits and a process operating such a device on an integrated circuit. In FIG. 8, the response S(T, σ) of a general representative sample of the stress sensor is determined for a level of stress σ and, for embodiments also accounting for temperature, a temperature value T, In the embodiment of FIG. 8, the temperature dependence is first determined at 801, followed by determining the stress dependence at 803. In other embodiments, the order of 801 and 803 can be reversed or, if temperature dependence is not considered a concern, 801 can be omitted.

Continuing with FIG. 8, at Sot the stress response of multiple devices is determined as a function of temperature, but with no stress applied to the devices: S(T, σ=0). Referring to the embodiment of FIG. 4, this would correspond to determining the variation of the DP[15:0] and DN[15:0] for stress-free devices over a range of temperature values.

At 803 the stress response of multiple devices is determined as a function of different applied stress levels σ at a fixed temperature T0: S(T=T0, σ). Referring to the embodiment of FIG. 4, this would correspond to determining the variation of the DP[15:0] and DN[15:0] for a range of stress values applied to the devices while at the fixed temperature value T0.

The results of 801 and 803 can then be used to predict the variation trend of S(T, σ) at 805 as a function of the stress level σ at different temperature values T. The stress determination circuit 401 can then use this information to translate the DP[15:0] and DN[15:0] values from the counters 413 and 423, along with the temperature value from temperature sensor 453, into a stress level on the integrated circuit FIG. 9 is a flowchart for an embodiment for determining the level of stress for a set of one or more integrated circuits, such as in a package as illustrated in FIG. 1. The use of in-situ monitoring can monitor mechanical stress during board installation, and also monitor the stress drift during operation. If a stress level reaches a critical value, preventive actions such as adjustments or early chip/board replacement can be done to prevent the system shut down.

Starting at 901, the stress sensor values of each of the die, Sn, can be measured at several temperatures Tk, Sn(Tk), at time 0 to determine the initial values for the each of the die across a range of temperature values. The process of 903-909 can then be used to monitor the stress levels on the integrated circuit die as they age.

Figure 10:
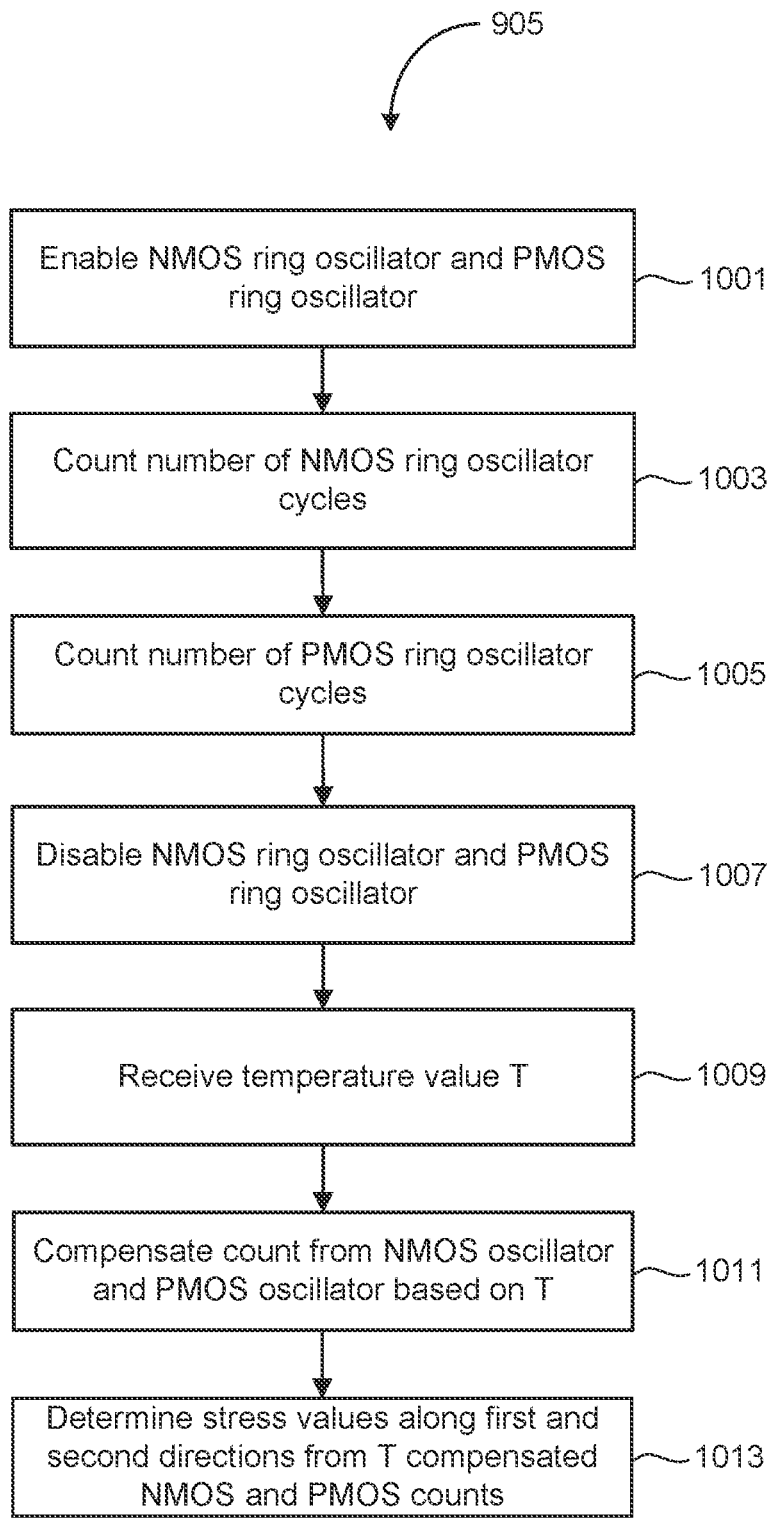
FIG. 10 is a flowchart for an embodiment of a process for extracting the stress level on an integrated circuit.

The responses of the stress sensors during device operation is monitored at 903 to determine response Sn(T, σ(t)) over time t as a function of temperature T. Referring to the embodiment of FIG. 4, this could correspond to the high accuracy time slot generator periodically asserting the enable signal en1 to generate the DP[15:0] and DN[15:0]. At 905, the stress determination circuit can extract the stress level based on the calibration process of FIG. 8. The frequency of such determination can be a fixed interval or a variable interval, such as determined by control logic (i.e., 325 of FIG. 3) of the integrated circuit. FIG. 10 looks at an embodiment for 905 in more detail. At 907 the stress determination circuit 401 can determine whether the stress level σ for any of the die is greater than a critical value. The critical value can be a predetermined level of stress for a given type of die, above which the operation of the die may be degraded. If the value of σ for one of the die exceeds the critical limit, the stress determination circuit can notify the control logic (i.e., 325 of FIG. 3) of the integrated circuit to issue a system alarm at 909. The system alarm could alert a user of the device that the die or whole package containing the die should be replaced or monitored more closely, as its performance may be degraded. If, at 907, none of the stress values a exceed the corresponding critical value, the flow loops back to 903 to continue the monitoring.

FIG. 10 is a flowchart for an embodiment of a process for extracting the stress level on an integrated circuit and is described with respect to the embodiment of FIG. 4. The flow of FIG. 10 can correspond to an embodiment for 905 of FIG. 9. Starting at 1001, the NMOS limited and PMOS limited ring oscillators are enabled. In the embodiment of FIG. 4, this can correspond to the time slot generator asserting the en1 signal to NMOS_RO 411 and PMOS_RO 421, where enable signal can be asserted in response to a control signal from the stress determination circuit 401 or other control circuitry on the die, such as control logic 325 of FIG. 3. Once enabled, the ring oscillators NMOS_RO 411 and PMOS_RO 421 run at respective frequencies f_nmos and f_pmos, where the number of cycles are respectively counted at 1003 and 1005 by counters 413 and 423. The ring oscillators NMOS_RO 411 and PMOS_RO 421 are then disabled after a time period at 1007 by de-asserting the enable signal en1. The corresponding count values DN[15:0] and DP[15:0] are then passed on to the stress determination circuit 401.

If the counts are to be compensated for temperature, at 1009 the stress determination circuit 401 receives a temperature value form the temperature sensor 453. The temperature value T can then be used compensate the counts DN[15:0] and DP[15:0] at 1011.

From the temperature compensated counts, the stress levels can be extracted at 1013. In an embodiment such as FIG. 4 with both NMOS limited and PMOS limited ring oscillators, the count from the PMOS limited ring oscillator will reflect the stress along the direction corresponding to the channel of the current limiting PMOS devices, such as 709, 719 and 729 of FIG. 7, as PMOS devices are sensitive to stress along the axis of their channels. As NMOS devices are sensitive to stresses both along and perpendicular to their channel direction, the count from the NMOS limited ring oscillator will reflect the stress in both of these directions relative to the channel of the current limiting NMOS devices, such as 607, 617 and 627 of FIG. 6. Consequently, the PMOS limited ring oscillator can give the stress along the channel direction, which can then be factored out of the stress value from the NMOS limited ring oscillator to isolate the perpendicular stress level. In some embodiments, being able to determine a direction as well as a magnitude can be used to determine a source for the stress, such as the tension level in a particular one of the screws 107 in FIG. 1.

Consequently, as described above, the inclusion of both a stress sensor and a temperature sensor near each other on an integrated circuit die enable temperature calibration of stress. By use of a complementary pair of ring oscillators, one with wider PMOS devices and the other with wider NMOS devices, the stress sensor can extract the stress along and perpendicular to the channel of the devices. Combining the stress sensor and temperature sensor for temperature calibration, the combination of ring oscillators with different NMOS and PMOS drive strength ratios to allows the sensor to decouple stress along or perpendicular to channels of the transistors, which in a finFET embodiment will typically be aligned along the same axis. For embodiments including a temperature sensor, this can help to differentiate ring oscillator frequency change caused by stress from frequency change due to temperature drift.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope be defined by the claims appended hereto.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A stress sensor, comprising:
   a first ring oscillator circuit on an integrated circuit comprising first one or more inverter stages, each inverter stage of the first one or more inverter stages having a first P-channel metal-oxide-semiconductor field-effect transistor (PMOS) device and a first N-channel metal-oxide-semiconductor field-effect transistor (NMOS) device connected in series between a high voltage supply level and a low voltage supply level such that the first NMOS device limits first current flowing through each inverter stage of the first one or more inverter stages relative to the first PMOS device;
   a second ring oscillator circuit on the integrated circuit in proximity to the first ring oscillator circuit, the second ring oscillator circuit comprising second one or more inverter stages, each inverter stage of the second one or more inverter stages having a second PMOS device and a second NMOS device connected in series between the high voltage supply level and the low voltage supply level such that the second PMOS device limits second current flowing through each inverter stage of the second one or more inverter stages relative to the second NMOS device; and
   a stress determination circuit configured to receive a first frequency signal generated by the first ring oscillator circuit and a second frequency signal generated by the second ring oscillator circuit and to determine, from the first frequency signal and the second frequency signal, a first stress value for a first stress level along a first stress direction of the integrated circuit and a second stress value for a second stress level along a second stress direction of the integrated circuit, the second stress direction being non-parallel to the first stress direction.

2. The stress sensor of claim 1, wherein, for each of the first one or more inverter stages of the first ring oscillator circuit, the first NMOS device has a first width narrower than the first PMOS device, and
for each of the second one or more inverter stages of the second ring oscillator circuit, the second PMOS device has a second width narrower than the second NMOS device.

3. The stress sensor of claim 2, wherein the first NMOS device has the first width narrower than the first PMOS device such that the first PMOS device has more fins than the first NMOS device, and wherein the second PMOS device has the second width narrower than the second NMOS device such that the second NMOS device has more fins than the second PMOS device.

4. The stress sensor of claim 1, wherein each of the first one or more inverter stages of the first ring oscillator circuit further comprise a third NMOS device connected in series with the first PMOS device and the first NMOS device between the high voltage supply level and the low voltage supply level, an input of each of the first one or more inverter stages connected to a first control gate of the first PMOS device and a third control gate of the third NMOS device and an output of each of the first one or more inverter stages is connected to a node through which the first PMOS device is connected to the third NMOS device.

5. The stress sensor of claim 4, wherein, for each of the first one or more inverter stages, the first NMOS device is connected between the node and the third NMOS device.

6. The stress sensor of any of claim 4, wherein, for each of the first one or more inverter stages, the first control gate of the first NMOS device is biased at a fixed level.

7. The stress sensor of claim 1, wherein each of the second one or more inverter stages of the second ring oscillator circuit further comprises a third PMOS device connected in series with the second PMOS device and the second NMOS device between the high voltage supply level and the low voltage supply level, an input of each of the second one or more inverter stages connected to a third control gate of the third PMOS device and a second control gate of the second NMOS device and an output of each of the second one or more inverter stages is connected to a node through which the third PMOS device is connected to the second NMOS device.

8. The stress sensor of claim 7, wherein, for each of the second one or more inverter stages, the second PMOS device is connected between the node and the third PMOS device.

9. The stress sensor of any one of claim 7, wherein, for each of the second one or more inverter stages, the second control gate of the second PMOS device is biased at a fixed level.

10. The stress sensor of claim 1, wherein the first PMOS device and the first NMOS device of each of the first one or more inverter stages of the first ring oscillator circuit and the second PMOS device and the second NMOS device of each of the second one or more inverter stages of the second ring oscillator circuit are oriented in a same stress direction on the integrated circuit.

11. The stress sensor of claim 1, wherein the first PMOS device and the first NMOS device of each of the first one or more inverter stages of the first ring oscillator circuit and the second PMOS device and the second NMOS device of each of the second one or more inverter stages of the second ring oscillator circuit are fin field-effect transistors (FinFETs).

12. The stress sensor of claim 1, wherein the stress determination circuit is further configured to receive a temperature value and to compensate the first stress value and the second stress value based on the temperature value.

13. The stress sensor of claim 1, further comprising:
a time slot generator configured to provide a common enable signal to the first ring oscillator circuit and the second ring oscillator circuit.

14. The stress sensor of claim 1, further comprising:
a first counter configured to receive the first frequency signal from the first ring oscillator circuit and provide the first frequency signal to the stress determination circuit in as a first digital value; and
a second counter configured to receive the second frequency signal from the second ring oscillator circuit and provide the second frequency signal to the stress determination circuit in as a second digital value.

15. The stress sensor of claim 1, wherein the second ring oscillator circuit is on the integrated circuit within a millimeter of the first ring oscillator circuit.

16. The stress sensor of claim 1, wherein the stress determination circuit is further configured to issue a system alarm in response to the first stress value exceeding a first critical value and in response to the second stress value exceeding a second critical value.

17. An integrated circuit, comprising:
a temperature sensor configured to determine a temperature value for the integrated circuit; and
a stress sensor in proximity to the temperature sensor, comprising:
one or more ring oscillator circuits comprising one or more inverter stages each having a P-channel metal-oxide-semiconductor field-effect transistor (PMOS) device and a N-channel metal-oxide-semiconductor field-effect transistor (NMOS) device connected in series between a high voltage supply level and a low voltage supply level; and
a stress determination circuit configured to receive one or more frequency signals generated by a corresponding one of the ring oscillator circuits and to receive the temperature value, and further configured to determine from the one or more frequency signals a stress value for a stress level of the integrated circuit and compensate the stress value based on the temperature value.

18. The integrated circuit of claim 17, wherein the temperature sensor comprises a band gap circuit.

19. The integrated circuit of claim 17, wherein the integrated circuit is a microprocessor circuit.

20. The integrated circuit of claim 17, wherein the one or more ring oscillator circuits comprise:
a first ring oscillator circuit comprising first one or more inverter stages each having a first PMOS device and a first NMOS device connected in series between the high voltage supply level and the low voltage supply level such that the first NMOS device limits first current flowing through each inverter stage of the first one or more inverter stages relative to the first PMOS device; and
a second ring oscillator circuit comprising second one or more inverter stages each having a second PMOS device and a second NMOS device connected in series between the high voltage supply level and the low voltage supply level such that the second PMOS device limits second current flowing through each inverter stage of the second one or more inverter stages relative to the second NMOS device, wherein the stress determination circuit is further configured to receive a first frequency signal generated by the first ring oscillator circuit and a second frequency signal generated from the second ring oscillator circuit and to determine from the first frequency signal and the second frequency signal a first stress value for a first stress level of the integrated circuit along a first stress direction and a second stress value for a second stress level of the integrated circuit along a second stress direction, the second stress direction being non-parallel to the first stress direction.

21. The integrated circuit of claim 20, wherein, for each of the first one or more inverter stages of the first ring oscillator circuit, the first NMOS device has a first width narrower than the first PMOS device, and for each of the second one or more inverter stages of the second ring oscillator circuit, that the second PMOS device has a second width narrower than the second NMOS device.

22. The integrated circuit of claim 21, wherein the first NMOS device has the first width narrower than the first PMOS device such that the first PMOS device has more fins than the first NMOS device, and wherein the second PMOS device has the second width narrower than the second NMOS device such that the second NMOS device has more fins than the second PMOS device.

23. The integrated circuit of claim 20, wherein each of the first one or more inverter stages of the first ring oscillator circuit further comprises a third NMOS device connected in series with the first PMOS device and the first NMOS device between the high voltage supply level and the low voltage supply level, an input of each of the first one or more inverter stages connected to a first control gate of the first PMOS device and a third control gate of the third NMOS device and an output of each of the first one or more inverter stages is connected to a node through which the first PMOS device is connected to the third NMOS device.

24. The integrated circuit of claim 23, wherein, for each of the first one or more inverter stages, the first NMOS device is connected between the node and the second NMOS device.

25. The integrated circuit of claim 23, wherein, for each of the first one or more inverter stages, the first control gate of the first NMOS device is biased at a fixed level.

26. The integrated circuit of claim 20, wherein each of the second one or more inverter stages of the second ring oscillator circuit further comprises a third PMOS device connected in series with that the second PMOS device and the second NMOS device between the high voltage supply level and the low voltage supply level, an input of each of the second one or more inverter stages connected to a third control gate of the third PMOS device and a second control gate of the second NMOS device and an output of each of the second one or more inverter stages is connected to a node through which the third PMOS device is connected to the second NMOS device.

27. The integrated circuit of claim 26, wherein, for each of the second one or more inverter stages, that the second PMOS device is connected between the node and the second PMOS device.

28. The integrated circuit of claim 26, wherein, for each of the second one or more inverter stages, the second control gate of that the second PMOS device is biased at a fixed level.

29. The integrated circuit of claim 20, wherein the first PMOS device and the first NMOS device of each of the first one or more inverter stages of the first ring oscillator circuit and that the second PMOS device and the second NMOS device of each of the second one or more inverter stages of the second ring oscillator circuit are oriented in a same stress direction on the integrated circuit.

30. The integrated circuit of claim 20, wherein the first PMOS device and the first NMOS device of each of the first one or more inverter stages of the first ring oscillator circuit and that the second PMOS device and the second NMOS device of each of the second one or more inverter stages of the second ring oscillator circuit are fin field-effect transistors (FinFETs).

31. The integrated circuit of claim 20, wherein the stress sensor further includes:

a time slot generator configured to provide a common enable signal to the first ring oscillator circuit and the second ring oscillator circuit.

32. The integrated circuit of any of claim 20, wherein the stress sensor further includes:

a first counter configured to receive the first frequency signal from the first ring oscillator circuit and provide the first frequency signal to the stress determination circuit in as a first digital value; and a second counter configured to receive the second frequency signal from the second ring oscillator circuit and provide the second frequency signal to the stress determination circuit in as a second digital value.

33. The integrated circuit of claim 17, wherein a temperature senor is formed circuit within a millimeter of the stress sensor.

34. The integrated circuit of claim 17, wherein the stress determination circuit is further configured to issue a system alarm in response to the stress value exceeding a critical value.

35. A method of monitoring stress on an integrated circuit, comprising:

enabling a first ring oscillator on the integrated circuit and a second ring oscillator adjacent to the first ring oscillator on the integrated circuit;

subsequently disabling the first ring oscillator and the second ring oscillator after a time interval;

determining a first count corresponding to a first number of cycles executed by the first ring oscillator during the time interval;

determining a second count corresponding to a second number of cycles executed by the second ring oscillator;

determining from the first count a first stress value for a first stress level of the integrated circuit along a first stress direction; and determining from the second count a second stress value for a second stress level of the integrated circuit along a second stress direction, the second stress direction being non-parallel to the first stress direction.

36. The method of claim 35, further comprising:

receiving a temperature value; and temperature compensating the first count and the second count based on the temperature value, wherein the first stress value is determined from the temperature compensated first count and the second stress value is determined from the temperature compensated second count.

37. The method of claim 35, further comprising:
   determining whether the first stress level of the integrated circuit along the first stress direction exceeds a first critical value;
   determining whether the second stress level of the integrated circuit along the second stress direction exceeds a second critical value; and
   in response to either of the first stress level of the integrated circuit along the first stress direction exceeding the first critical value and the second stress level of the integrated circuit along the second stress direction exceeding the second critical value, issuing a system alarm.

38. The method of claim 35, wherein second stress count is determined from a combination of the second count and the first count.

* * * * *

UNITED STATES PATENT AND TRADEMARK OFFICE
CERTIFICATE OF CORRECTION

PATENT NO. : 11,719,584 B2
APPLICATION NO. : 17/351675
DATED : August 8, 2023
INVENTOR(S) : Gu et al.

It is certified that error appears in the above-identified patent and that said Letters Patent is hereby corrected as shown below:

In the Claims

In Column 13, in Claim 6, Line 35, delete "of any of" and insert -- of --.

In Column 13, in Claim 9, Line 54, delete "of any one of" and insert -- of --.

In Column 16, in Claim 32, Line 21, delete "of any of" and insert -- of --.

In Column 16, in Claim 33, Line 33, delete "senor" and insert -- sensor --.

Signed and Sealed this
Twenty-fourth Day of October, 2023

Katherine Kelly Vidal
Director of the United States Patent and Trademark Office